(12) United States Patent
Sota et al.

(10) Patent No.: US 6,285,086 B1
(45) Date of Patent: Sep. 4, 2001

(54) SEMICONDUCTOR DEVICE AND SUBSTRATE FOR SEMICONDUCTOR DEVICE

(75) Inventors: Yoshiki Sota, Nara; Hiroyuki Juso, Gose, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/559,253

(22) Filed: Apr. 27, 2000

(30) Foreign Application Priority Data

Jun. 29, 1999 (JP) .................................................. 11-182804

(51) Int. Cl.$^7$ ........................... H01L 23/48; H01L 23/52; H01L 29/40
(52) U.S. Cl. ........................... 257/786; 257/698; 257/692
(58) Field of Search ..................................... 257/786, 780, 257/781, 737, 738, 692, 698, 783; 361/767, 768, 771, 783, 748, 808, 820; 438/613, 614, 615, 616, 617; 228/180.12

(56) References Cited

U.S. PATENT DOCUMENTS

| | | | |
|---|---|---|---|
| 5,450,290 | * | 9/1995 | Boyko et al. . |
| 5,784,262 | * | 7/1998 | Sherman . |
| 5,798,563 | * | 8/1998 | Feilchenfeld et al. . |
| 5,812,378 | * | 9/1998 | Fjelstsad . |
| 6,064,114 | * | 5/2000 | Higgins et al. . |
| 6,140,710 | * | 10/2000 | Greenberg . |

FOREIGN PATENT DOCUMENTS 9-121002    5/1997 (JP) .

* cited by examiner

Primary Examiner—Sheila V. Clark
(74) Attorney, Agent, or Firm—Nixon & Vanderhye

(57) ABSTRACT

In a substrate for a semiconductor device including a plurality of first through holes and a wiring pattern having a conductive land portion covering the entire surface of the opening of each of the first through holes on one surface, a second through hole is formed in a region other than the forming region of the wiring pattern, and the shape of opening of said second through hole is not a circular shape and has a corner portion.

16 Claims, 4 Drawing Sheets

SEMICONDUCTOR DEVICE AND SUBSTRATE FOR SEMICONDUCTOR DEVICE

BACKGROUND OF THE INVENTION

1. Field of the Invention

The present invention relates generally to a substrate for a semiconductor device and a semiconductor device, and more particularly, to a substrate for a semiconductor device and a semiconductor device substantially reduced to a chip size suitable for high density packaging.

2. Description of the Background Art

Chip-size Package (CSP) semiconductor devices such as QFP (Quad Flat Package) type or BGA (Ball Grid Array) type devices have been in wide use to cope with the recent trend toward lighter and more compact apparatus in the market of electrical appliances and adapt to automated assembly process. Increased speed and number of functions in signal processing by semiconductor elements incorporated in these semiconductor devices require a larger number of external connection terminals.

In such a case, a BGA type device having external connection terminals arranged two-dimensionally at the bottom of the semiconductor device is employed. Some devices are formed to be as small as possible so that they can be incorporated into compact mobile equipment, in other words they are formed to have a size close to a chip size. There is a conventional resin encapsulation type semiconductor device as disclosed in Japanese Patent Laying-Open No. 9-121002. In such devices, a semiconductor chip is mounted on an interconnection substrate, electrical conduction with the interconnection substrate is secured by wire-bonding, and then resin encapsulation is achieved to protect the semiconductor chip, wiring and the like. External connection terminals are formed by reflow or the like.

A semiconductor device having this structure is mounted by reflow onto a wiling board such as a printed circuit board for an actual electronic device. When these external connection terminals are formed or when the semiconductor device is mounted onto the wiring board by reflow, moisture in the semiconductor device could evaporate and expand. In order to solve the problem, as shown in FIG. 7, a plan view of a conventional semiconductor device from the surface to form an external connection terminal, a second through hole 19 to discharge moisture remaining between the semiconductor chip of the semiconductor device and an insulating substrate 15 is provided in insulating substrate 15 in a region between a plurality of first through holes 18 where external connection terminals are formed. Note that a land 17 for connecting an external connection terminal is exposed from first through hole 18.

After the mounting by reflow, stress is generated at the connection portion between the semiconductor device and the wiring board because of their different line expansion coefficients or the like in a heating cycle or the like. The above-described semiconductor device has one side of semiconductor chip 1 encapsulated with mold resin 2, and therefore a bowing part forms in the semiconductor device as shown in FIG. 6, if the temperature changes because of a phenomenon characteristic to a bimetal-like structure between semiconductor chip 1 and mold resin 2. FIG. 6 is a view showing stress caused between mounting board 10 and the semiconductor device. The semiconductor device is mounted to mounting board 10 by an external connection terminal 4.

The difference in the above line expansion coefficient or the bowing of the semiconductor device could cause cracks at the connection portion between the semiconductor device and the wiring board, leading to breaking in some cases. At this time, if there are small holes (second through holes) to prevent the trouble associated with reflow as described above, the circular shape of the small holes could not provide enough stress alleviation effect, and therefore a trouble could be caused in a heating cycle following the mounting. Such conventional small holes are formed by drilling and therefore have a circular shape.

SUMMARY OF THE INVENTION

It is an object of the present invention is to provide a semiconductor substrate for a semiconductor device and a semiconductor device which allow the reliability relative to thermal stress to be improved after being mounted onto a wiring board such as a printed circuit board in a chip-size package.

A substrate for a semiconductor device according to one aspect of the present invention includes an insulating substrate and a conductive layer. The insulating substrate has one surface, the other surface opposing the one surface, and a plurality of first through holes communicating between the one surface and the other surface. The conductive layer has a conductive portion formed to cover the openings of the first through holes in the one surface of the insulating substrate. In a region of the insulating substrate without the conductive layer, a second through hole communicating between the one surface and the other surface is formed. The shape of the opening of the second through hole has a corner portion.

Preferably, the shape of the opening of the second through hole is a cross shape. Also preferably, the shape of the opening of the second through hole is an L shape. The shape of the opening of the second through hole may be a rectangular shape.

The second through hole is preferably provided between a plurality of the first through holes. The second through hole may be provided outside the region of the insulating substrate where the conductive portion is formed. The insulating substrate has a region without the conductive portion in the center, and the second through hole may be provided in this central region.

A semiconductor device according to another aspect of the present invention includes an insulating substrate, a conductive layer and a semiconductor chip. The insulating substrate has one surface, the other surface opposing the one surface, and a plurality of first through holes communicating between the one surface and the other surface. The conductive layer has a conductive portion formed to cover the openings of the first through holes in the one surface of the insulating substrate. The semiconductor chip is mounted on the one surface of the insulating substrate. A second through hole communicating between the one surface and the other surface is formed in the region of the insulating substrate without the conductive layer. The shape of the opening of the second through hole has a corner portion. The conductive layer and the semiconductor chip are electrically connected.

Preferably, the semiconductor device further includes a plurality of external connection terminals electrically connected to the conductive portion through the first through holes in the insulating substrate. Also preferably, the semiconductor device further includes a bonding wire to electrically connect the conductive layer and the semiconductor chip.

Preferably, the shape of the opening of the second through hole is a cross shape. Also preferably, the shape of the opening of the second through hole is an L shape. The shape of the second through hole may be a rectangular shape.

Preferably, the second through hole is provided between a plurality of the first through holes. The second through hole may be provided outside the region of the insulating substrate where the conductive portion is formed. The insulating substrate has a region without the conductive portion in the center and the second through hole may be formed in this central region.

According to the present invention, the shape of a small hole (second through hole) provided in a region without a conductive portion as a land for an external connection terminal in order to prevent the trouble associated with heat at the time of packaging is not circular, and has a shape easy to deform by stress caused by the heat. Since the small hole deforms, the binding force generated between terminals upon the substrate deformation after packaging is reduced, which alleviates stress imposed upon the terminals, so that the semiconductor device can resist thermal stress after the semiconductor device is mounted onto a mounting or wiring board.

The use of the substrate for a semiconductor device or the semiconductor device according to the present invention allows the reliability relative to thermal stress after packaging onto the wiring board such as a printed circuit board to be improved in a chip size packaging.

In addition, the shape of the opening of the second through hole is preferably a cross shape, so that the stress alleviation effect can be provided to stress both in the longitudinal and transverse directions of the package.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be now described in detail.

The semiconductor device according to this embodiment is a foursquare type CSP having external connection terminals provided at a lower portion or the entire back surface of the semiconductor device, but the invention is not limited to this arrangement.

Figure 1:
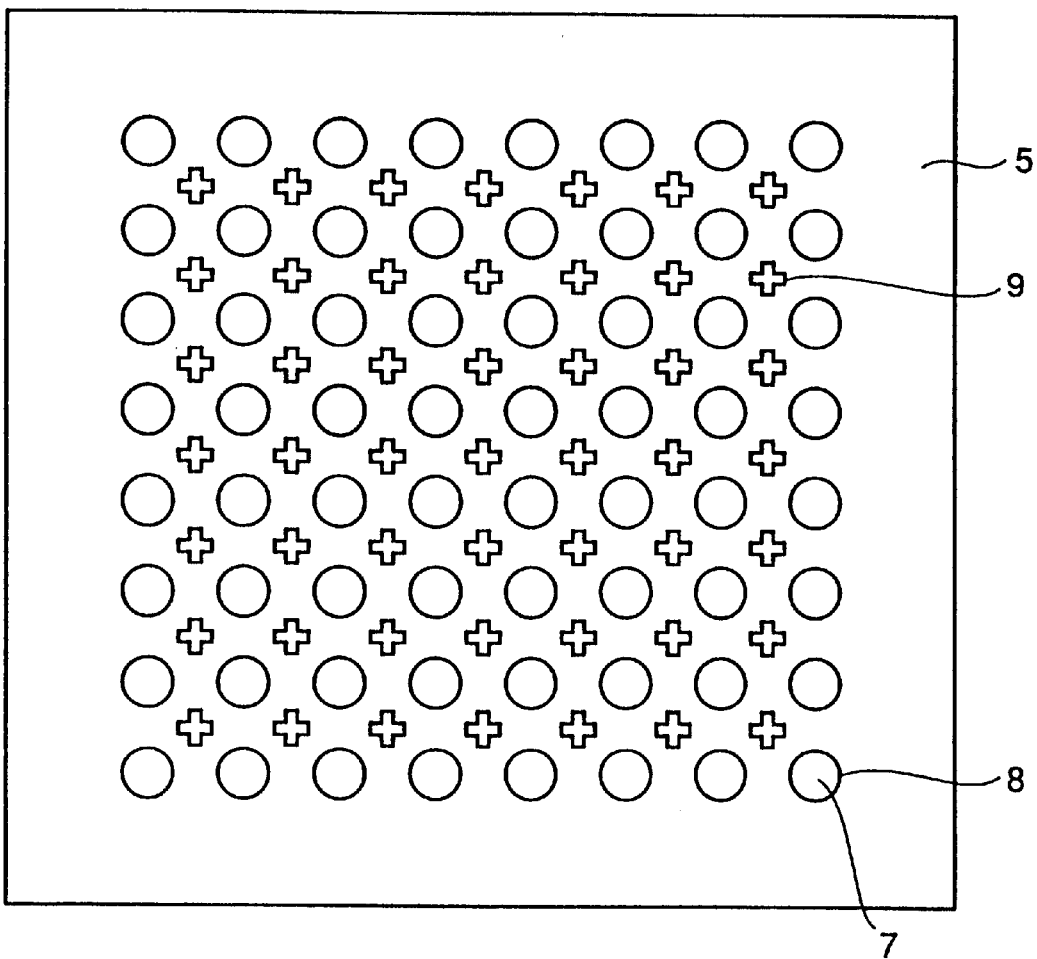
FIG. 1 is a view of first and second through holes in an insulating substrate in a semiconductor device according to the present invention.
Figure 2:
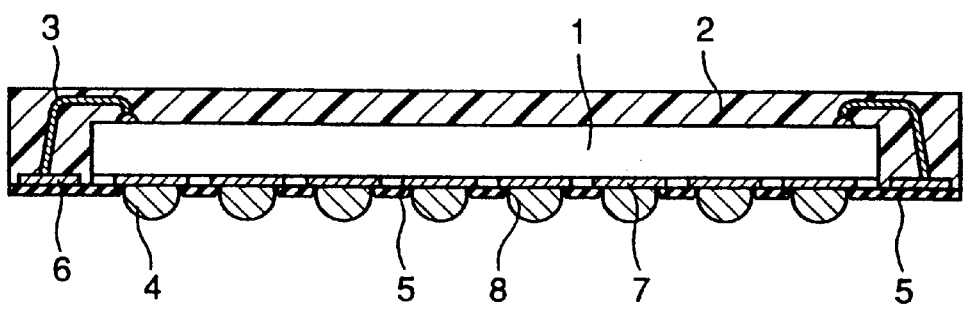
FIG. 2 is a cross sectional view of a semiconductor device according to the present invention.

As shown in FIGS. 1 and 2, a wiring (interconnection) pattern 6 is formed as a conductive layer on the semiconductor chip mounting surface of a wiring board (such as a printed circuit board) 5 as an insulating substrate, and formed on the opposite surface side is a first through hole 8 which exposes a surface of a land portion 7 as a conductive portion to be a connection region with each of external connection terminals 4 in an area array arrangement.

Semiconductor chip 1 is then mounted on wiring board 5, and electrical connection between wiring board 5 and semiconductor chip 1 is secured by wire-bonding using a gold wire 3. Then, semiconductor chip 1 and gold wire 3 are encapsulated with encapsulation resin 2 by a transfer molding method, and land portion 7 and a solder ball as external connection terminal 4 are electrically connected in first through hole 8.

One embodiment of the present invention will be now described.

A wiring pattern 6 is formed on the mounting surface of a semiconductor chip, and on the opposite side surface thereof, a wiring board 5 having a land portion 7 which can be connected to each of external connection terminals 4 in an area array arrangement is provided, and the material of the board needs only be an insulating material which for example includes polyimide, an epoxy substrate impregnated with a glass cloth, and an aramid resin substrate. Note that the substrate is preferably thin because the semiconductor device is used in mobile equipment for example, but in view of the production line, the substrate should be thick enough to provide strength to endure the transfer. In this embodiment, a polyimide board is used, and the thickness of the board is 0.05 mm.

Note that a copper foil forming wiring pattern 6 on the polyimide board has a thickness of 18 $\mu$m. At this time, wiring board 5 may be a structure generally referred to as a three-layer board having a copper foil and polyimide laminated with an adhesive may be used for wiring board 5, and the polyimide may be plated with copper or a board generally referred to as a two-layer board having polyimide formed on the copper foil by a method called casting may be employed. In this embodiment, a two layer board having polyimide plated with copper is used.

As shown in FIG. 1, using the same mask, etching is conducted to simultaneously form a first through hole 8 which exposes a surface of land portion 7 in the polyimide portion of the two-layer polyimide board, and a cross-shaped second through hole 9 in a region between a plurality of the first through holes 8 and outside the forming region of land portion 7 to prevent the trouble caused by the influence of the evaporation/expansion of moisture included in the semiconductor device when the semiconductor device is provided with heat. At this time, since the two-layer polyimide board is processed, the mask for etching the polyimide can be processed into the following shape. The opening size of land portion 7 is $\phi$0.4 mm, and the size of cross-shaped, second through hole 9 has holes as wide as 0.1 mm and as long as 0.3 mm being crossed.

Figure 3A:
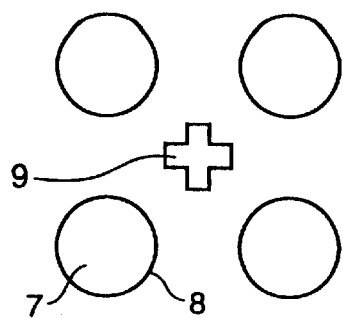
FIG. 3A is a backside view of a semiconductor device according to the present invention where the shape of the opening of a second through hole is a cross shape.
Figure 3C:
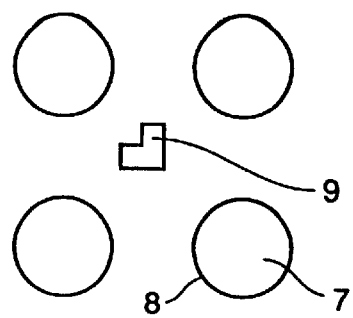
FIG. 3C is a backside view of a semiconductor device where the shape is an L shape.
Figure 3B:
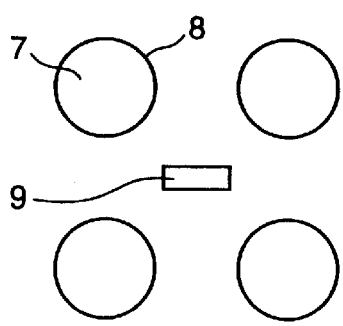
FIG. 3B is a backside view of a semiconductor device where the shape is a linear shape.
Figure 3D:
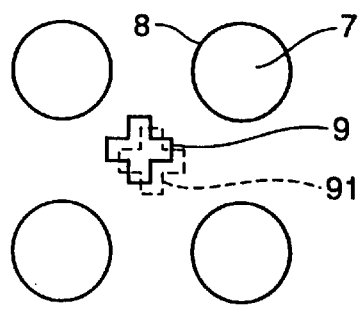
FIG. 3D is a backside view of a semiconductor device where a second through hole is moved from an intermediate position between external connection terminals.

According to the present invention, the shape of the opening of second through hole 9 needs only be other than a conventional circular shape, and preferably has a corner portion. The shape of the opening of second through hole 9 does not have to be a cross shape as in the embodiment as shown in FIG. 3A, but may be a linear shape (rectangular) as shown in FIG. 3B or an L shape as shown in FIG. 3C. The size may be different from the size as described above, and second through hole 9 does not have to be at a position 91 in the middle between lands as shown in FIG. 3D. Providing the holes in the middle between lands is the most effective, but the position may be changed depending on the wiring pattern. If the shape of the opening of second through hole 9 is a cross shape, stress in any of longitudinal and transverse directions of the package can be most effectively addressed, but if such a cross shape opening is difficult to form depending upon the relation with the wiling pattern, a linear or L shaped opening as shown in FIG. 3B or 3C may be employed.

In this embodiment, since a board is processed by etching, a conventional method may be used with changes in a mask, but if a three-layer board or the like is used, dice or a laser is used to process second through hole 9. In this case, etching processing cannot be employed because an adhesive is between a copper foil and polyimide, and the adhesive cannot be etched with an etchant for polyimide, so that the copper foil cannot be exposed.

Figure 4:
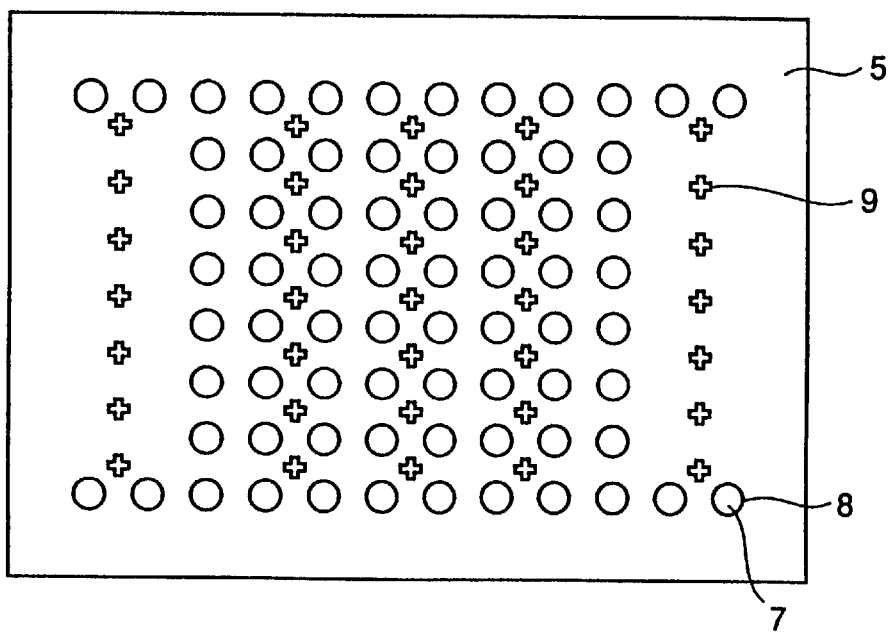
FIG. 4 is a view of an embodiment having through holes provided outside external connection terminals.

Also, as shown in FIG. 4, second through hole 9 may be formed outside the region of land portion 7. In this case, a dummy terminal is provided at each of the four corners of wiring board 5 to improve the reliability after the mounting, and thermal stress imposed upon the dummy terminal can be alleviated, which allows the reliability relative to thermal stress after the mounting to be improved.

Figure 5:
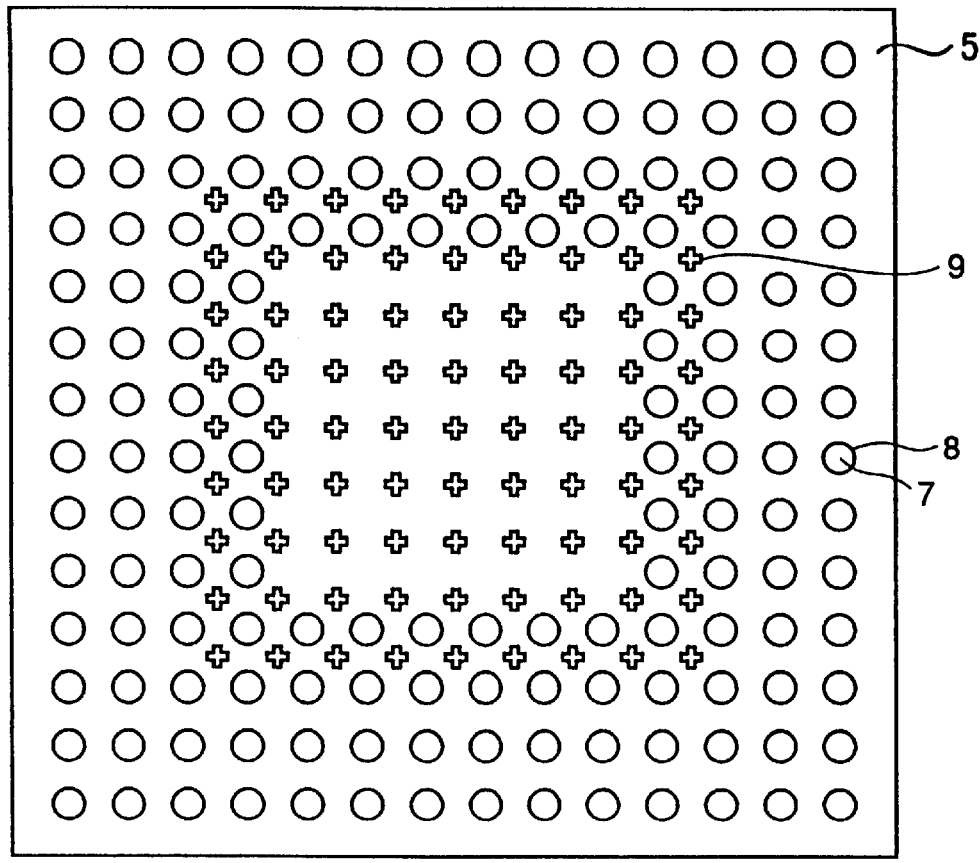
FIG. 5 is a view of an example of an arrangement of through holes in a semiconductor device with no external connection terminal in the central portion.
Figure 6:
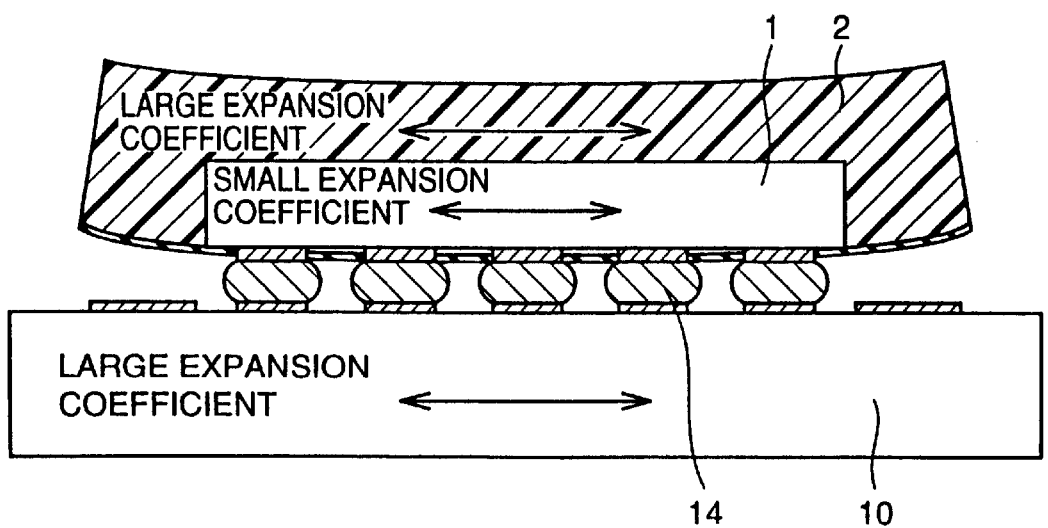
FIG. 6 is a view showing stress caused between a wiling board and a semiconductor device.
Figure 7:
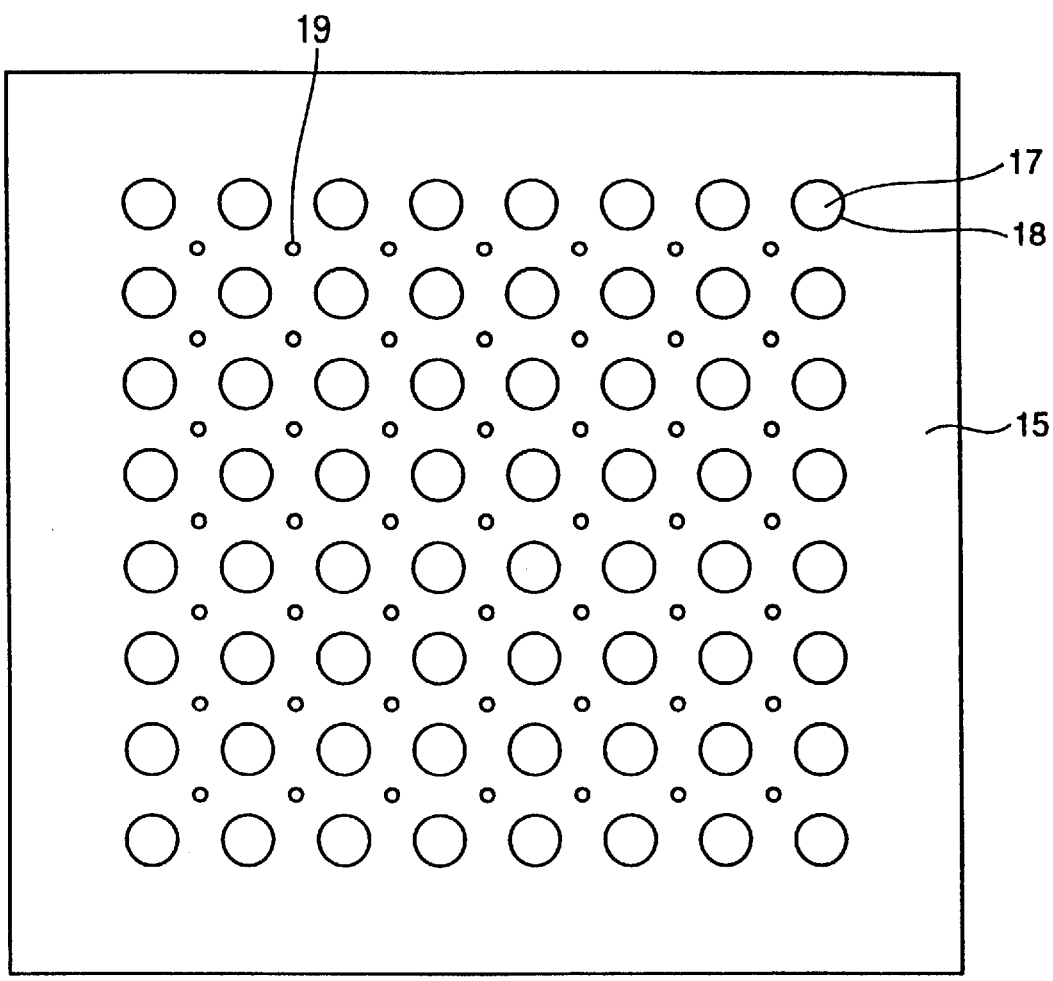
FIG. 7 is a view of a through hole in an insulating substrate in a conventional semiconductor device, seen from the side of an external connection terminal.

As shown in FIG. 5, in a semiconductor device without any external connection terminal in the center, second through hole 9 may be provided in a region where land portion 7 is not provided in the center of wiring board 5. In addition, depending upon the wiring pattern and chip size, second through hole 9 may be provided only in a region in the center of wiring board 5 without any external connection terminal.

Thereafter, the copper foil is patterned to form wiring pattern 6. After wiring pattern 6 is formed, the copper foil is plated. The plating is performed using nickel/gold and thus a substrate for a semiconductor device according to the present invention is manufactured.

Then, semiconductor chip 1 is thermally press-joined onto the wiring pattern 6 of wiring board 5 using an adhesive film for die bonding. The adhesive film is formed by previously forming an insulating, thin film sheet on the backside of the chip, and heating the sheet to be joined to the board. The film is formed on the backside surface of the chip by attaching the adhesive film on the entire backside surface of the wafer when the semiconductor chip is still in a wafer state, and then dicing (cutting) the same together with the sheet attached to the backside into a chip shape. Then, the pad of the semiconductor chip and the wire bond terminal portion of wring pattern 6 on wiring board 5 are connected using a metallic wire 3 to establish electrical conduction. In this embodiment, a gold wire having a diameter of 25 $\mu$m is used.

Then, resin encapsulation is performed by a transfer molding method. After the resin encapsulation, an external connection terminal 4 is formed at land portion 7 for connecting the external connection terminal on the backside surface of wiling board 5. In this embodiment, a solder ball is mounted at first through hole 8 and fused by reflow to form external connection terminal 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate for a semiconductor device comprising:
   an insulating substrate having one surface, the other surface opposing the one surface and a plurality of first through holes communicating between the one surface and the other surface; and
   a conductive layer having a conductive portion formed to cover the opening of said first through hole in the one surface of said insulating substrate,
   a second through hole communicating between the one surface and the other surface being formed in a region of said insulating substrate without said conductive layer, the opening of said second through hole having a corner portion.

2. The substrate according to claim 1, wherein the shape of the opening of said second through hole is a cross shape.

3. The substrate according to claim 1, wherein the shape of the opening of said second through hole is an L shape.

4. The substrate according to claim 1, wherein the shape of the opening of said second through hole is a rectangular shape.

5. The substrate according to claim 1, wherein said second through hole is provided between a plurality of said first through holes.

6. The substrate according to claim 1, wherein said second through hole is provided outside a region of said insulating substrate where said conductive portion is formed.

7. The substrate according to claim 1, wherein said insulating substrate has a region without said conductive portion in the center, and said second through hole is provided in this central portion.

8. A semiconductor device comprising:
   an insulating substrate having one surface, the other surface opposing the one surface, and a plurality of first through holes communicating between the one surface and the other surface;
   a conductive layer having a conductive portion formed to cover the opening of said first through hole in the one surface of said insulating substrate; and
   a semiconductor chip mounted on the one surface of said insulating substrate,
   a second through hole communicating between the one surface and the other surface being formed in a region of said insulating substrate without said conductive layer, the shape of the opening of said second through hole having a corner portion,
   said conductive layer and said semiconductor chip being electrically connected.

9. The semiconductor device according to claim 8, further comprising a plurality of external connection terminals each electrically connected to said conductive portion through said first through hole in said insulating substrate.

10. The semiconductor device according to claim 8, further comprising a bonding wire electrically connecting said conductive layer and said semiconductor chip.

11. The semiconductor device according to claim 8, wherein the shape of the opening of said second through hole is a cross shape.

12. The semiconductor device according to claim 8, wherein the shape of the opening of said second through hole is an L shape.

13. The semiconductor device according to claim 8, wherein the shape of the opening of said second through hole is a rectangular shape.

14. The semiconductor device according to claim 8, wherein said second through hole is provided between a plurality of said first through holes.

15. The semiconductor device according to claim 8, wherein said second through hole is provided outside a region of said insulating substrate where said conductive portion is formed.

16. The semiconductor device according to claim 8, wherein said insulating substrate has a region without said conductive portion in the center, and said second through hole is provided in this central region.

* * * * *